United States Patent
Taira

(10) Patent No.: US 9,530,903 B2
(45) Date of Patent: Dec. 27, 2016

(54) SOLAR CELL MANUFACTURING METHOD, SOLAR CELL MODULE MANUFACTURING METHOD, AND SOLAR CELL MODULE

(71) Applicant: SANYO Electric Co., Ltd., Moriguchi-shi, Osaka (JP)

(72) Inventor: Shigeharu Taira, Hyogo (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 1 day.

(21) Appl. No.: 14/534,942

(22) Filed: Nov. 6, 2014

(65) Prior Publication Data

US 2015/0059824 A1 Mar. 5, 2015

Related U.S. Application Data

(63) Continuation of application No. PCT/JP2012/068820, filed on Jul. 25, 2012.

(51) Int. Cl.
*H01L 21/00* (2006.01)
*H01L 31/042* (2014.01)
(Continued)

(52) U.S. Cl.
CPC ........... *H01L 31/0201* (2013.01); *H01L 22/20* (2013.01); *H01L 31/022425* (2013.01);
(Continued)

(58) Field of Classification Search
CPC .................. H01L 31/0201; H01L 31/022425; H01L 31/022433; H01L 31/04; H01L 31/042; H01L 31/1876; H01L 31/188; H01L 22/00; H01L 22/10; H01L 22/14; H01L 22/22; H01L 22/20; H02S 50/00; H02S 50/10; H02S 50/15
See application file for complete search history.

(56) References Cited

U.S. PATENT DOCUMENTS 4,256,513 A * 3/1981 Yoshida ............ H01L 31/02242
106/1.14
7,005,306 B1 * 2/2006 Poris ...................... H01L 22/14
257/E21.53
(Continued)

FOREIGN PATENT DOCUMENTS

| JP | 8-70533 A | 3/1996 | |
|---|---|---|---|
| JP | 10-65198 A | 3/1998 | |
| JP | 2004-193586 A | 7/2004 | |
| JP | WO 2011024264 A1 * | 3/2011 | ..... H01L 31/022433 |
| JP | 2012-43870 A | 3/2012 | |

OTHER PUBLICATIONS

International Search Report relating to PCT/JP2012/068820; Date of Mailing: Sep. 11, 2012; 3 pages, with English translation.

*Primary Examiner* — Eli Mekhlin
(74) *Attorney, Agent, or Firm* — Cantor Colburn LLP

(57) ABSTRACT

This solar cell module (10) is manufactured by connecting in series with a wiring material (15) multiple solar cells including at least two types of solar cells (11A, 11B) having different electrode structures, and covering the same with a first protective member (12) and a second protective member (13). This solar cell is manufactured by producing a photoelectric conversion unit, measuring characteristic values of the photoelectric conversion unit, selecting electrode structure on the basis of said characteristic values, and forming an electrode on the photoelectric conversion unit.

13 Claims, 9 Drawing Sheets

(51) Int. Cl.
*H02N 6/00* (2006.01)
*H01L 31/02* (2006.01)
*H01L 31/0224* (2006.01)
*H01L 31/05* (2014.01)
*G01R 31/40* (2014.01)
*H02S 50/10* (2014.01)
*H01L 21/66* (2006.01)
*H01L 31/18* (2006.01)

(52) U.S. Cl.
CPC .... *H01L 31/022433* (2013.01); *H01L 31/042* (2013.01); *H01L 31/0504* (2013.01); *H01L 31/188* (2013.01); *H01L 31/1876* (2013.01); *H02S 50/00* (2013.01); *H02S 50/10* (2014.12); *Y02E 10/50* (2013.01); *Y02P 70/521* (2015.11)

(56) References Cited

U.S. PATENT DOCUMENTS

| | | | |
|---|---|---|---|
| 2004/0159102 A1 | 8/2004 | Toyomura et al. | |
| 2010/0059106 A1* | 3/2010 | Akimoto | H01B 1/16 136/252 |
| 2010/0173446 A1* | 7/2010 | Khadilkar | C03C 3/066 438/72 |
| 2010/0229925 A1* | 9/2010 | Kim | H01L 31/02242 136/252 |
| 2011/0180139 A1* | 7/2011 | Adachi | H01B 1/22 136/256 |
| 2012/0048362 A1* | 3/2012 | Lee | H01L 31/02168 136/256 |
| 2012/0125420 A1* | 5/2012 | Karakida | H01L 31/02243 136/255 |

* cited by examiner

SOLAR CELL MANUFACTURING METHOD, SOLAR CELL MODULE MANUFACTURING METHOD, AND SOLAR CELL MODULE

CROSS-REFERENCE TO RELATED APPLICATION

The present application is a continuation under 35 U.S.C. §120 of PCT/JP2012/068820, filed Jul. 25, 2012, which is incorporated herein by reference and which claimed priority to PCT/JP2012/063762 filed May 29, 2012. The present application likewise claims priority under 35 U.S.C. §119 to PCT/JP2012/063762 filed May 29, 2012, the entire content of which is also incorporated herein by reference.

TECHNICAL FIELD

The present invention relates to a solar cell manufacturing method, a solar cell module manufacturing method, and a solar cell module.

BACKGROUND ART

Patent Literature 1 discloses a method for manufacturing a solar cell module used in electronic equipment, such as mobile phones, by removing solar battery cells determined to be defective in a characteristic inspection process of solar battery cells and using only solar battery cells determined to be acceptable.

CITATION LIST

Patent Literature

Patent Literature 1: Japanese Patent Laid-Open Publication No. 2012-43870

SUMMARY OF INVENTION

Technical Problem

Incidentally, in the manufacture of solar cell modules, there is a demand for improving yields while maintaining intended favorable output characteristics. The technique disclosed in Patent Literature 1 still has room for improvement in yield enhancement.

Solution to Problem

A solar cell manufacturing method according to the present invention includes producing photoelectric conversion units, measuring characteristic values of the photoelectric conversion units to select an electrode structure on the basis of the characteristic values, and forming electrodes on the photoelectric conversion units.

A solar cell module manufacturing method according to the present invention includes connecting in series a plurality of solar cells including at least two types of solar cells having a different electrode structure from each other, manufactured by the above-described solar cell manufacturing method using a wiring material, and covering the solar cells with a pair of protective members.

A solar cell module according to the present invention includes at least two types of solar cells formed on photoelectric conversion units that have a different electrode structure from each other, and wiring materials for connecting the solar cells.

Advantageous Effect of Invention

According to the present invention, it is possible to provide a solar cell and a solar cell module having favorable output characteristics and capable of being manufactured at an excellent yield rate.

DESCRIPTION OF EMBODIMENTS

Hereinafter, a solar cell module 10 which is one example of embodiments according to the present invention will be described in detail, while referring to the accompanying drawings, though the present invention is not limited in application to this example. Drawings to be referred to in each embodiment are schematically-drawn illustrations, and therefore, the dimensional ratios and the like of constituent elements depicted in each drawing may differ from actual components. Specific dimensional ratios and the like should therefore be determined by taking into consideration the description given below.

Figure 1:
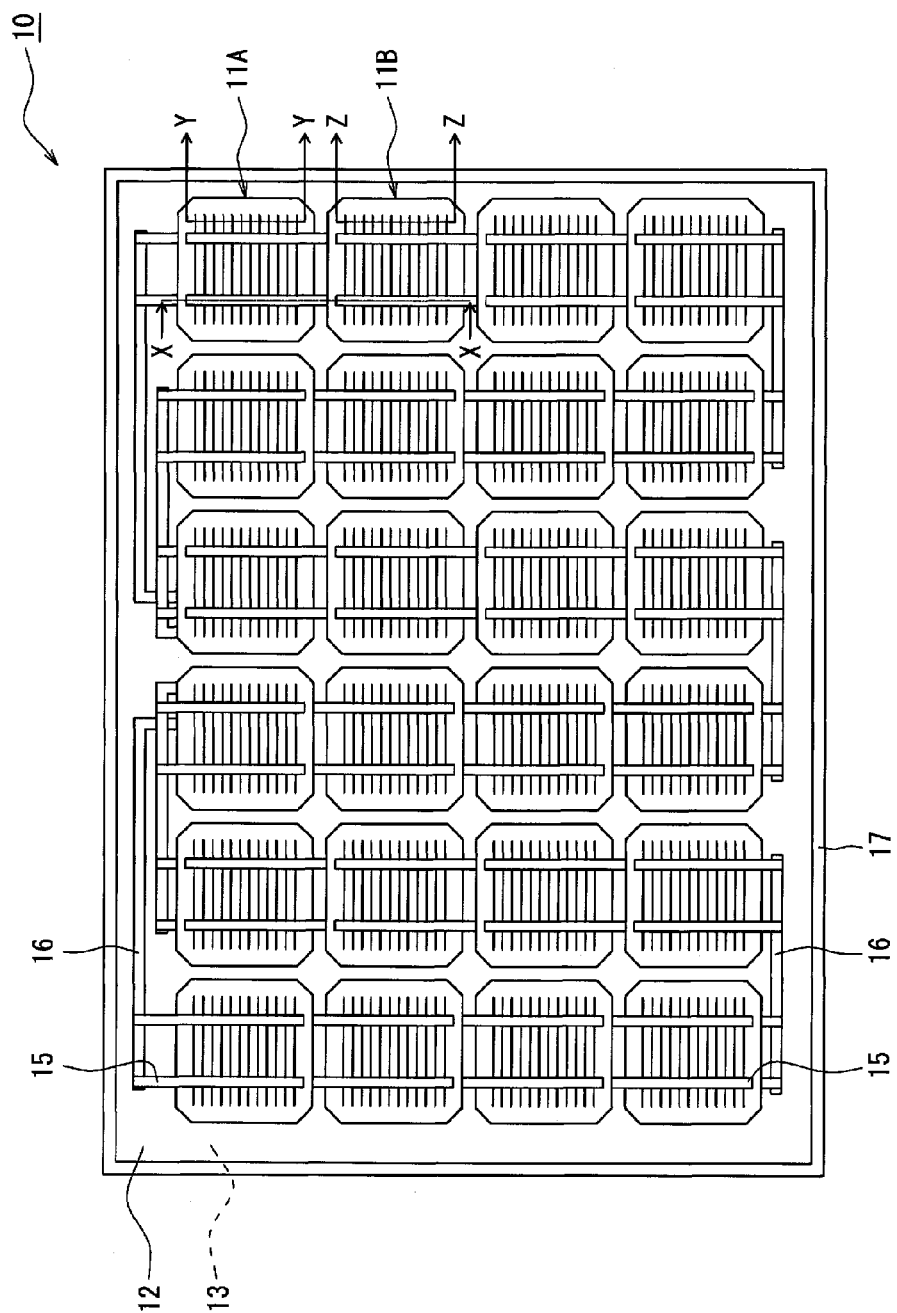
FIG. 1 is a plan view taken from the light-receiving side of a solar cell module which is one example of embodiments according to the present invention.
Figure 2:
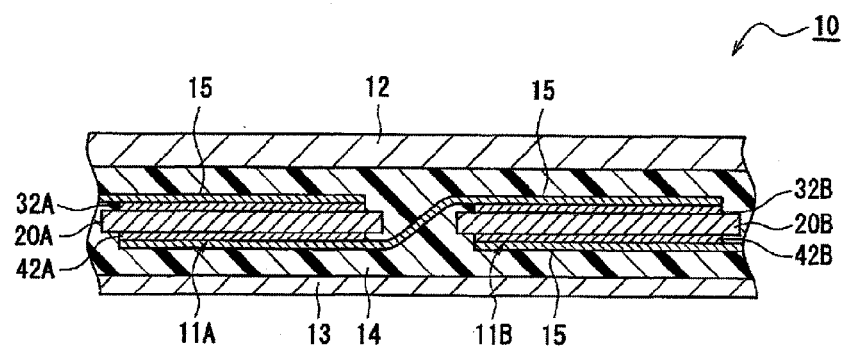
FIG. 2 is a drawing illustrating part of the X-X line cross section of FIG. 1.
Figure 3:
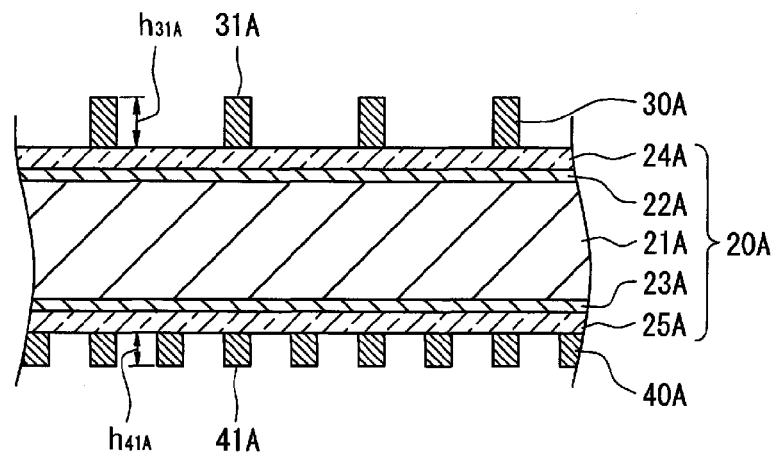
FIG. 3 is a drawing illustrating part of the Y-Y line cross section of FIG. 1.
Figure 4:
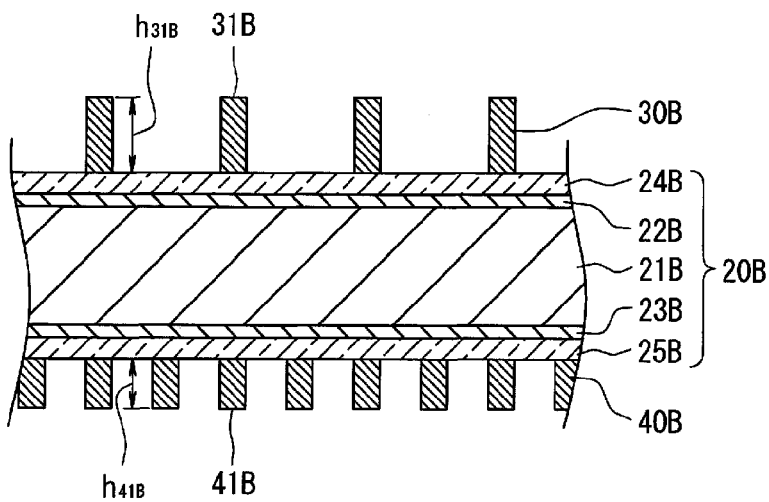
FIG. 4 is a drawing illustrating part of the Z-Z line cross section of FIG. 1.

The configuration of the solar cell module 10 will be described while referring to FIGS. 1 to 4. FIG. 1 is a plan view taken from the light-receiving side of the solar cell module 10. FIGS. 2 to 4 are cross-sectional views taken by cutting the solar cell module 10 in the thickness direction thereof along the X-X line, the Y-Y line and the Z-Z line of FIG. 1, respectively.

The solar cell module 10 is provided with a plurality of solar cells 11A and 11B, a first protective member 12 disposed on the light-receiving side of the solar cells 11A and 11B, and a second protective member 13 disposed on the back side of the solar cells 11A and 11B. The plurality of solar cells 11A and 11B is held between the first protective member 12 and the second protective member 13 and sealed up with a filler 14. For the first protective member 12 and the second protective member 13, a translucent member such as a glass substrate, a resin substrate, or a resin film may be used. For the filler 14, a resin such as ethylene-vinyl acetate copolymer (EVA) may be used.

The solar cell module 10 is provided with wiring materials 15 for connecting a plurality of solar cells in series. As illustrated in FIG. 2, when adjacently-disposed solar cells 11A and 11B are connected to each other, one end of each wiring material 15 is attached to a later-described bus bar electrode 42A of the solar cell 11A. The other end of the wiring material 15 is attached to a later-described bus bar electrode 32B of the solar cell 11B. The wiring material 15 bends in the thickness direction of the solar cell module 10 between the adjacent solar cells 11A and 11B to connect the respective solar cells in series.

The solar cell module 10 is further provided with, for example, a frame 17 attached to the periphery of crossover wiring materials 16 for interconnecting wiring materials 15, the first protective member 12 and the second protective member 13, an unillustrated terminal box, and the like.

The solar cell module 10 includes at least two types of solar cells 11A and 11B, as described above. As will be specifically described later, the solar cells 11A and 11B are classified according to the characteristics (characteristic values) of the photoelectric conversion units 20A and 20B and have different electrode structures from each other. In the present specification, constituent elements related to the solar cell 11A are suffixed with "A", whereas constituent elements related to the solar cell 11B are suffixed with "B".

The solar cells 11A and 11B are respectively provided with the photoelectric conversion units 20A and 20B for generating carriers by receiving solar light, first electrodes 30A and 30B which are light-receiving surface electrodes formed on the light-receiving surfaces of the photoelectric conversion units, and second electrodes 40A and 40B which are backside electrodes formed on the back surfaces of the photoelectric conversion units. In the solar cells 11A and 11B, carriers generated in the photoelectric conversion units 20A and 20B are collected by the first electrodes 30A and 30B and the second electrodes 40A and 40B, respectively. Here, "light-receiving surface" refers to a surface which solar light mainly enters from outside the solar cells, whereas "back surface" refers to a surface on the opposite of the light-receiving surface. For example, more than 50% to 100% of solar light incident on the solar cells enters from the light-receiving side.

The photoelectric conversion units 20A and 20B are preferably classified according to at least a fill factor. Hereinafter, the fill factor of the photoelectric conversion units is defined as "$FF_0$" and the fill factor of the solar cells is defined as "FF". For example, each photoelectric conversion unit 20A has $FF_0$ equal to or greater than a predetermined threshold value, and each photoelectric conversion unit 20B has $FF_0$ less than the predetermined threshold value. The predetermined threshold value is, for example, the standardized lower limit (hereinafter referred to as "$FF_L$") of $FF_0$. Each photoelectric conversion unit 20B, which has been manufactured so that $FF_0$ thereof is equal to or greater than $FF_L$, has had a low $FF_0$ due to a variation in manufacturing process conditions. Accordingly, the photoelectric conversion units 20A and 20B macroscopically have the same structure. In addition, the solar cells 11A and 11B are common to each other in that both include finger electrodes and bus bar electrodes. Hereinafter, a discussion will be made of the solar cells 11A for contents common to the solar cells 11A and 11B.

Each photoelectric conversion unit 20A includes a substrate 21A made from a semiconducting material, such as crystalline silicon (c-Si), gallium arsenide (GaAs) or indium phosphorus (InP), an amorphous semiconductor layer 22A formed on the light-receiving surface of the substrate 21A, and an amorphous semiconductor layer 23A formed on the back surface of the substrate 21A. As the substrate 21A, an n-type monocrystal silicon substrate is preferred in particular. A texture structure 26A (see FIG. 12 to be described later) is preferably formed on the light-receiving surface of the substrate 21A. In addition, a texture structure is also preferably formed on the back surface of the substrate 21A.

The texture structure 26A refers to a microscopic concavo-convex structure intended to reduce the reflection of light and enhance light receiving efficiency. Specific examples of the texture structure 26A include a pyramid-shaped concavo-convex structure obtained by performing anisotropic etching on an n-type monocrystal silicon substrate the principal surface of which is a (100) face. The size of the texture structure 26A (hereinafter referred to as "Tx size" in some cases) is preferably 0.5 μm to 20 μm or so. The Tx size refers to a size when a planar view is taken of the principal surface of the substrate 21A and can be measured using a scanning electron microscope (SEM) or a laser microscope. Hereinafter, the diameter of the circumscribed circle of the texture structure 26A is defined as the Tx size, though the definition of the Tx size is not particularly limited. In addition, the Tx size means an average value in an area of 1 mm² or wider. The depth of a concave portion of the texture structure 26A is, for example, several μm or so. Since the thickness of the amorphous semiconductor layer 22A and a later-described transparent conductive layer 24A are, for example, several nm to several hundred nm or so, the texture structure 26A also develops on these thin-film layers.

The amorphous semiconductor layer 22A has a laminar structure in which an i-type amorphous silicon layer and a p-type amorphous silicon layer, for example, are formed in order. The amorphous semiconductor layer 23A has a laminar structure in which an i-type amorphous silicon layer and an n-type amorphous silicon layer, for example, are formed in order. Note that the photoelectric conversion unit 20A may have a structure in which an i-type amorphous silicon layer and an n-type amorphous silicon layer are formed in order on the light-receiving surface of the substrate 21A, and an i-type amorphous silicon layer and a p-type amorphous silicon layer are formed in order on the back surface of the substrate 21A.

The photoelectric conversion unit 20A is preferably provided with a transparent conductive layer 24A on the amorphous semiconductor layer 22A and a transparent conductive layer 25A on the amorphous semiconductor layer 23A. The transparent conductive layers 24A and 25A are composed of, for example, transparent conductive oxide formed by doping metal oxide, such as indium oxide ($In_2O_3$) or zinc oxide (ZnO), with tin (Sn), antimony (Sb) or the like. The transparent conductive layers 24A and 25A are formed so as to, for example, cover the entire surfaces of the amorphous semiconductor layers 22A and 23A except the edges thereof.

The first electrodes 30A include a plurality of (for example, 50) finger electrodes 31A and a plurality of (for example, 2) bus bar electrodes 32A formed on the transparent conductive layer 24A. The finger electrodes 31A are thin line-like electrodes formed over a wide range on the transparent conductive layer 24A. The bus bar electrodes 32A are electrodes used to collect carriers from the finger electrodes 31A. In the first electrode 30A, the respective bus bar electrodes 32A are disposed parallel to each other at a predetermined interval and the plurality of finger electrodes 31A are disposed orthogonally to these bus bar electrodes. Some of the plurality of finger electrodes 31A extend from the respective bus bar electrodes 32A toward the edge of the light-receiving surface, and the rest of the finger electrodes 31A connect the respective bus bar electrodes 32A.

Like the first electrodes 30A, the second electrodes 40A include a plurality of (for example, 250) finger electrodes 41A and a plurality of (for example, 2) bus bar electrodes 42A formed on the transparent conductive layer 25A. The layout of the respective electrodes is the same as the layout of the first electrodes 30A.

The width of each finger electrode 31A is preferably 30 µm to 150 µm or so, and more preferably 40 µm to 100 µm or so, from the viewpoint of a reduction in light shadow loss, or the like. The width of each bus bar electrode 32A is preferably smaller than the width of the wiring material 15, and is preferably 50 µm to 300 µm or so, more preferably 80 µm to 150 µm or so. That is, part of each wiring material 15 protrudes from a surface of each bus bar electrode 32A and connects to a finger electrode 31A.

The thicknesses of each finger electrode 31A and each bus bar electrode 32A are 40 µm to 150 µm or so, preferably 60 µm to 100 µm or so, and particularly preferably equivalent to each other, from the viewpoint of a reduction in resistive loss, or the like. The electrode thickness is a length from a surface of the transparent conductive layer 24A to the topmost point of each electrode along the thickness direction of the substrate 21A. If the texture structure 26A is present, the electrode thickness is a length from a convex portion of the texture structure 26A. The electrode thickness can be measured by means of cross-sectional observation using a SEM, a laser microscope or the like.

Since the second electrodes 40 are generally less susceptible to the effect of light shadow loss, the width of the finger electrodes 41A can be made larger, compared with, for example, the finger electrodes 31A. In addition, the thickness of the finger electrodes 41A can be decreased by increasing the width thereof and making the finger electrodes 41A larger in number than the finger electrodes 31A.

The first electrodes 30A and the second electrodes 40A (hereinafter, these electrodes may be generically referred to as "electrodes" in some cases), have a structure in which, for example, a conductive filler is dispersed in binder resin such as epoxy resin. For the conductive filler, there is used, for example, metal particles made from silver (Ag), copper (Cu), nickel (Ni) or the like, carbon, or a mixture thereof. Among these materials, Ag particles are preferred. The electrodes are formed by, for example, a screen printing method using conductive paste. The electrodes can also be formed by a printing method (for example, an ink-jet method or a flexo printing method) other than an electrolytic plating method and a screen printing method. When the electrodes are formed by a printing method, conductive paste is preferably heat-treated after being printed, to remove a solvent in the paste and thermally harden the binder resin.

The first electrodes 30B of the solar cell 11B include finger electrodes 31B formed in the same type of electrode arrangement as the first electrodes 30A, and bus bar electrodes 32B. Likewise, the second electrodes 40B include finger electrodes 41B formed in the same type of electrode arrangement as the first electrodes 40A, and bus bar electrodes 42B. The solar cells 11A and 11B differ from each other, however, in the pattern of electrode formation, in particular, the pattern of finger electrode formation. More particularly, the solar cells 11A and 11B differ from each other in the thicknesses of finger electrodes corresponding to each other, as illustrated in FIGS. 3 and 4. That is, the thickness $h_{31B}$ of each finger electrode 31B is larger than the thickness $h_{31A}$ of each finger electrode 31A ($h_{31B} > h_{31A}$), and the thickness $h_{41B}$ of each finger electrode 41B is larger than the thickness $h_{41A}$ of each finger electrode 41A ($h_{41B} > h_{41A}$).

As described above, the solar cell module 10 includes two types of solar cells 11A and 11B in which the thicknesses of corresponding finger electrodes differ from each other. For example, the average value of the thickness $h_{31B}$ (hereinafter referred to as "average thickness [$h_{31B}$]") is larger than the average value of the thickness $h_{31A}$ (hereinafter referred to as "average thickness [$h_{31A}$]"). The average thicknesses are calculated for each solar cell on the basis of at least 10% of the total number of finger electrodes. In each solar cell, certain degrees of variation are present in [$h_{31A}$] and [$h_{31B}$]. [$h_{31B}$] is intentionally set so as to be larger than [$h_{31A}$], and the difference between [$h_{31A}$] and [$h_{31B}$] is at least larger than the variations. That is, the minimum value of [$h_{31B}$] is preferably larger than the maximum value of [$h_{31A}$]. In addition, as in the case of [$h_{31B}$], the average thickness [$h_{41B}$] of the finger electrodes 41B is also larger than the average thickness [$h_{41A}$] of the finger electrodes 41A.

The thicknesses of portions of the finger electrodes 31B and 41B which are close to the bus bar electrodes 32B and 42B, respectively, and to which the wiring materials 15 are connected, can be made equivalent to the thicknesses of the bus bar electrodes 32B and 42B, respectively. Consequently, the wiring materials 15 and the bus bar electrodes 32B and 42B can be connected to each other. That is, some of the finger electrodes of the solar cell 11B may have portions equivalent in thickness to corresponding finger electrodes of the solar cell 11A. Alternatively, portions where $h_{31B} < h_{31A}$ may be present in the finger electrodes of the solar cell 11B.

Figure 5:
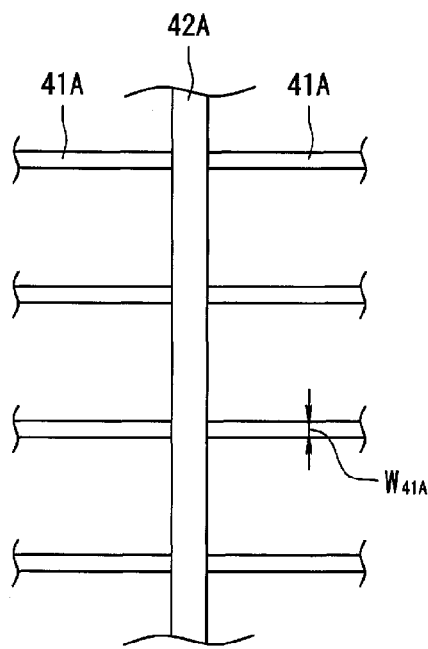
FIG. 5 is a plan view illustrating part of the electrodes of a solar cell which is one example of embodiments according to the present invention.
Figure 6:
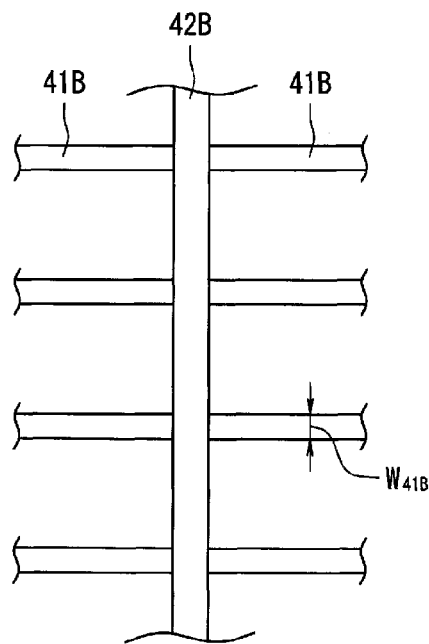
FIG. 6 is a plan view illustrating part of the electrodes of a solar cell which is one example of embodiments according to the present invention.

In FIGS. 3 and 4, patterns of electrode formation have been shown in which the thicknesses of finger electrodes differ from each other. Alternatively, the width of corresponding finger electrodes may be differentiated from each other between the solar cell 11A and the solar cell 11B. In the examples illustrated in FIGS. 5 and 6, the width $W_{41B}$ of the finger electrodes 41B is made larger than the width $W_{41A}$ of the finger electrodes 41A. In addition, the width $W_{31B}$ of the finger electrodes 31B may be made larger than the width $W_{31A}$ of the finger electrodes 31A, though this is not illustrated. From the viewpoint of a reduction in light shadow loss, or the like, [$h_{31B}$] may be made larger than [$h_{31A}$] without making the width $W_{31B}$ larger on the light-receiving side. On the back side, the width $W_{41B}$ may be made larger than the width $W_{41A}$ without making [$h_{41B}$] larger.

The patterns of electrode formation of the solar cells 11A and 11B may be differentiated from each other by varying the number of electrodes and an electrode pitch, in addition to the electrode thickness and the electrode width. A change in the number of electrodes and the electrode pitch is preferably made not to the bus bar electrodes but to the finger electrodes. The electrode structures of the solar cells 11A and 11B may be differentiated by changing electrode materials, in addition to the patterns of electrode formation. Examples of the differentiation include differentiating the amount of conductive filler contained in electrodes between the solar cells 11A and 11B. Specifically, the contained amount of conductive filler composing the electrodes of the solar cell 11B can be made larger than the contained amount of conductive filler composing the electrodes of the solar cell 11A.

In any of the above-described embodiments, the used amount of conductive material (for example, a conductive filler) composing electrodes is larger in the solar cell 11B than in the solar cell 11A. That is, the solar cell 11B has an electrode structure lower in resistance than the electrode structure of the solar cell 11A.

Structures other than those described above can be applied to the photoelectric conversion units. For example, the photoelectric conversion units may have a structure in which an i-type amorphous silicon layer and an n-type amorphous silicon layer are formed in order on the light-receiving side of a substrate composed of n-type monocrystalline silicon or the like, and a p-type region composed of an i-type amorphous silicon layer and a p-type amorphous silicon layer and an n-type region composed of an i-type amorphous silicon layer and an n-type amorphous silicon layer are formed on the back side of the substrate. In this case, electrodes (p-side and n-side electrodes) are disposed only on the back side of the substrate. Alternatively, the photoelectric conversion units may have a structure formed of a substrate composed of a p-type polycrystalline silicon or the like, an n-type diffusion layer formed on the light-receiving surface of the substrate, and an aluminum metal layer formed on the back surface of the substrate.

Figure 7:
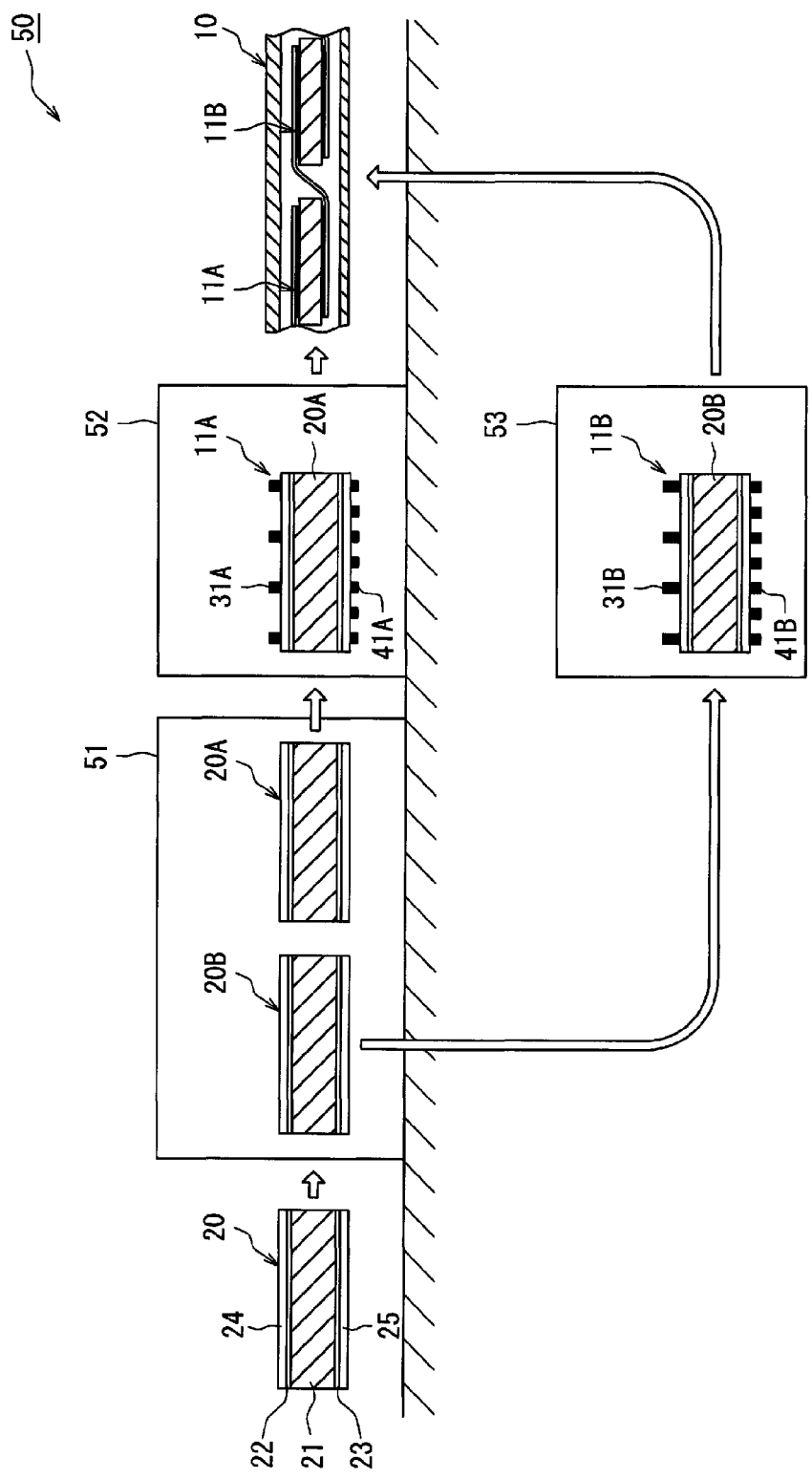
FIG. 7 is a drawing used to describe a method for manufacturing a solar cell and a solar cell module, each of which is one example of embodiments according to the present invention.
Figure 8:
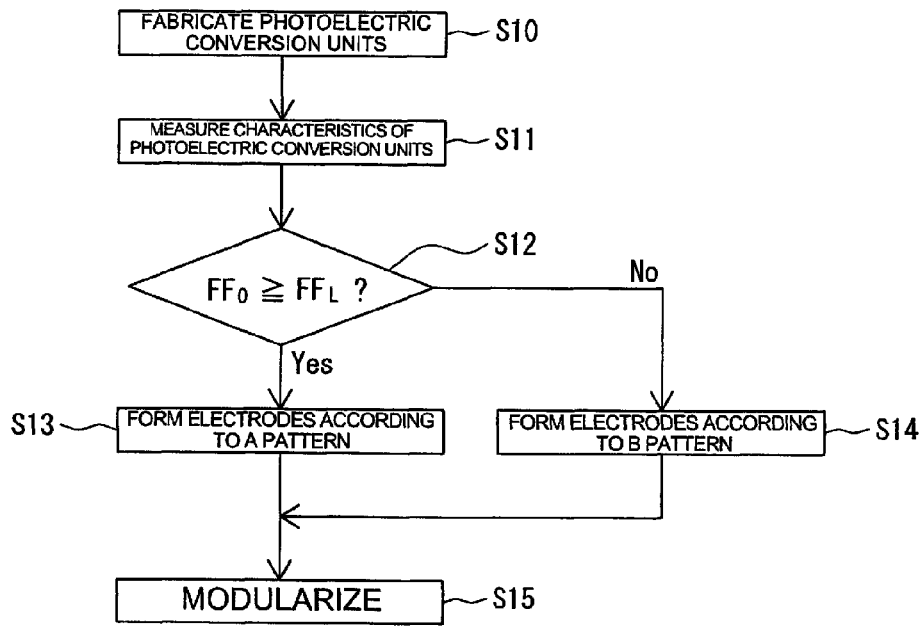
FIG. 8 is a flowchart used to describe a method for manufacturing a solar cell and a solar cell module, each of which is one example of embodiments according to the present invention.
Figure 9:
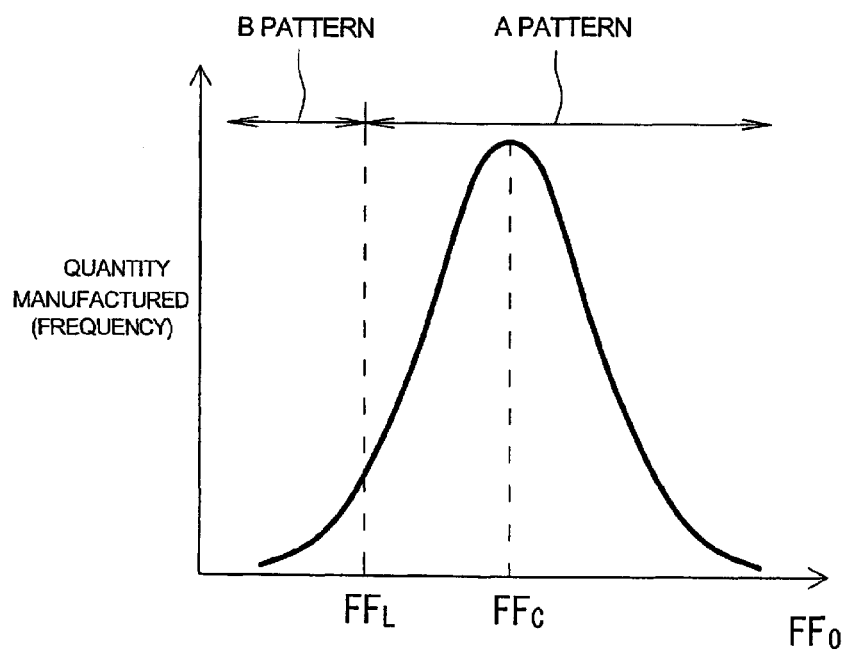
FIG. 9 is a drawing used to describe a method for manufacturing a solar cell and a solar cell module, each of which is one example of embodiments according to the present invention.

One example of a method for manufacturing the solar cell module 10 having the above-described configuration will be described while referring to FIGS. 7 to 9. FIG. 7 is a schematic view illustrating an overall process for manufacturing solar cells 11 and the solar cell module 10. Although hatching is partially excluded from the illustration in FIG. 7 in order to clarify the drawing, every block represents a cross-sectional view. FIG. 8 is a flowchart of the process (hereinafter referred to as "main process" in some cases) shown by way of example here. FIG. 9 is a drawing illustrating the relationship between $FF_0$ of each photoelectric conversion unit manufactured in the main process and a pattern of electrode formation.

In the main process, manufacturing conditions are set so that a photoelectric conversion unit 20A having $FF_0$ of a predetermined target value (hereinafter referred to as "$FF_C$") is obtained. A variation occurs in $FF_0$, however, due to a fluctuation in the conditions. Consequently, some non-standard photoelectric conversion units 20B are manufactured having $FF_0$ which is lower than $FF_L$. In addition, a manufacturing system 50 is used for automatically measuring $FF_0$ of photoelectric conversion units 20 (photoelectric conversion units before being classified into the photoelectric conversion units 20A and 20B) in the main process. The manufacturing system 50 is provided with a database containing information used to execute the sorting and the like of the photoelectric conversion units 20 to automatically sort the photoelectric conversion units 20 into the photoelectric conversion units 20A and 20B on the basis of the measured $FF_0$ and the information read out from the database. Manufacturing systems are not limited to this system, however. The measurement of $FF_0$ and the sorting of photoelectric conversion units may be performed by operator.

The rated values of the photoelectric conversion units 20, for example, are stored in the database of the manufacturing system 50 as the abovementioned information. $FF_C$ and $FF_L$ can be mentioned as examples of the rated values to be stored. In addition to these rated values, rated values related to $R_0$, $Iso_0$ and $Voc_0$ to be described later, the Tx size, and the like can also be mentioned as examples. The measured characteristic values of the photoelectric conversion units 20 may be accumulated in the database, and the manufacturing system 50 may automatically change rated values and the like using the accumulated data. In the main process, a selection of an electrode structure is made as a result of automatically comparison of the rated values previously stored in the database and the measured characteristic values with each other.

As illustrated in FIGS. 7 and 8, the photoelectric conversion units 20 are manufactured first in the process for manufacturing the solar cell module 10 (S10). An amorphous semiconductor layer 22 including an i-type amorphous silicon layer and a p-type amorphous silicon layer, and a transparent conductive layer 24, for example, are formed in order on the light-receiving surface of the substrate 21. In addition, an amorphous semiconductor layer 23 including an i-type amorphous silicon layer and an n-type amorphous silicon layer, and a transparent conductive layer 25, for example, are formed in order on the back side of the substrate 21. In this step, the respective layers can be formed by placing a cleaned substrate 21 inside a vacuum chamber and using a CVD or sputtering method.

In the CVD-based film formation of i-type amorphous silicon layers, there is used, for example, a raw material gas prepared by diluting silane ($SiH_4$) with hydrogen ($H_2$). In the case of p-type amorphous silicon layers, there can be used a raw material gas prepared by adding diborane ($B_2H_6$) to silane and diluting the resulting gas with hydrogen ($H_2$). In the case of n-type amorphous silicon layers, there can be used a raw material gas prepared by adding phosphine ($PH_3$) to silane and diluting the resulting gas with hydrogen ($H_2$).

In step S10, texture structures are preferably formed on the light-receiving surface and back surface of the substrate 21 before the abovementioned respective layers are stacked. The texture structures are formed on the light-receiving surface and the back surface of the substrate 21 as the result of the substrate 21 being immersed in, for example, an etching liquid. As a preferred etching liquid, there can be mentioned an alkaline solution, such as a sodium hydroxide (NaOH) solution or a potassium hydroxide (KOH) solution, if the substrate 21 is a monocrystalline silicon substrate having a (100) face. The Tx size can be adjusted by changing the substrate 21, the concentration of an etching liquid, a treating time, and the like to be used. An etching gas can also be used to form the texture structures.

Subsequently, the characteristic values of the photoelectric conversion units are measured (S11). The characteristic values measured in step S11 are important factors used to determine an electrode structure, and a short-circuit current $Iso_0$ and an open-circuit voltage $Voc_0$ to be describe later may be used as the characteristic values. The characteristic values preferably include at least $FF_0$, however. In the main process, only $FF_0$ is used. Next, an electrode structure is determined on the basis of the measured characteristic values. Specifically, an electrode structure is selected by comparing $FF_0$ and a predetermined threshold value (S12). In the main process, $FF_L$ is used as the predetermined threshold value. In step S12, a determination is made as to whether or not $FF_0$ of each photoelectric conversion unit 20 is equal to or greater than $FF_L$ ($FF_0 \geq FF_L$). If $FF_0 \geq FF_L$ (i.e., the photoelectric conversion unit 20 corresponds to a photoelectric conversion unit 20A), the pattern of electrode formation is specified as an A pattern. If $FF_0 < FF_L$ (i.e., the photoelectric conversion unit 20 corresponds to a photoelectric conversion unit 20B), the pattern of electrode formation is specified as a B pattern lower in resistance than the A pattern. In this case, there are two types of electrode structures to be selected.

$FF_0$ of each photoelectric conversion unit 20 can be measured by a heretofore-known method, such as a PL imaging method or a sunsVoc method. With the PL imaging method or the sunsVoc method, it is also possible to measure the open-circuit voltage $Voc_0$ of photoelectric conversion units. Note that an $FF_0$ measurement may be made before the transparent conductive layers 24 and 25 are formed.

In steps S11 and S12, the manufacturing system 50, for example, carries photoelectric conversion units 20 to a characteristic value-measuring location 51 to measure $FF_0$ for all of the photoelectric conversion units 20. Next, the manufacturing system 50 classifies the photoelectric conversion units 20 into photoelectric conversion units 20A and 20B on the basis of the measured $FF_0$ and $FF_L$ previously stored in the database. Then, the manufacturing system 50 carries the photoelectric conversion units 20A to an electrode-forming location 52 and the photoelectric conversion units 20B to an electrode-forming location 53. The electrode-forming location 52 is a place where electrodes are formed according to the A pattern, whereas the electrode-forming location 53 is a place where electrodes are formed according to the B pattern.

Here, a description will be given of the photoelectric conversion units 20A and 20B and the respective electrode structures (A and B patterns) thereof. Any redundant descriptions will not be given here, however.

As illustrated in FIG. 9, a variation in $FF_0$ of each photoelectric conversion unit 20 generally follows a normal distribution with $FF_C$ at the center. In the main process, photoelectric conversion units 20A having $FF_0$ that is equal to $FF_C$ are manufactured most, along with some photoelectric conversion units 20B having $FF_0$ of less than $FF_L$. $FF_L$ can be set optionally, taking into consideration the performance and yield of solar cells. For example, $FF_L$ can be set so that approximately 10% of the total quantity of photoelectric conversion units 20 correspond to photoelectric conversion units 20B in order from the lowest $FF_0$.

A solar cell degrades in fill factor due to the formation of electrodes (i.e., $FF_0 > FF$), but the degree of degradation varies depending on an electrode structure. Specifically, the fill factor is less likely to degrade with a decrease in the resistance of the electrode structure. Accordingly, in step S12, the A pattern which is a standard pattern of electrode formation is applied to photoelectric conversion units 20A, and the B pattern which is lower in resistance than the A pattern is applied to photoelectric conversion units 20B. That is, the electrode structure is preferably made lower in resistance with a decrease in $FF_0$. Consequently, the degradation of a fill factor can be suppressed more when photoelectric conversion units 20B which are non-standard units are used than when photoelectric conversion units 20A are used. In addition, FF of the solar cell 11B can be made close or equivalent to FF of the solar cell 11A.

The thickness of a corresponding finger electrode is set so as to be larger in the B pattern than in the A pattern. The A pattern includes the finger electrodes 31A and 41A, whereas the B pattern includes the finger electrodes 31B and 41B in which $[h_{31A}] < [h_{31B}]$ and $[h_{41A}] < [h_{41B}]$. Bus bar electrodes are set to, for example, the same thickness in both the A and B patterns.

The A and B patterns may be differentiated from each other in the width and the number of electrodes. If the A and B patterns are differentiated from each other in the electrode width, the B pattern is made larger in electrode width than the A pattern. If the A and B patterns are differentiated from each other in the number of electrodes, the B pattern is made larger in the number of electrodes than the A pattern. Alternatively, the A and B patterns may be differentiated from each other in the contained amount of conductive filler composing electrodes. In this case, the B pattern is made larger in the contained amount of conductive filler than the A pattern. As a further alternative, the A and B patterns may be differentiated from each other in a plurality of factors selected from the group consisting of the electrode thickness, the electrode width, the number of electrodes, and the contained amount of conductive filler.

Subsequently, electrodes are formed according to the A pattern in the electrode-forming location 52 for photoelectric conversion units 20A (S13). With this step, the solar cell 11A is manufactured. For photoelectric conversion units 20B, electrodes are formed according to the B pattern in the electrode-forming location 53 (S14). With this step, the solar cell 11B is manufactured.

When electrodes are formed by a screen printing method using conductive paste, a printing plate larger in plate thickness (preferably adjusted by the thickness of a later-described mask material) than a printing plate used in the electrode-forming location 52, for example, is used in the electrode-forming location 53. That is, in this case, a selection of an electrode structure is made by selecting a printing plate on the basis of the above-mentioned characteristic values. Alternatively, the same printing plate may be used for the respective patterns, but the frequency of printing may be differentiated. For example, conductive paste may be monolayer-printed in the case of the A pattern but multilayer-printed in the case of the B pattern. If the contained amount of conductive filler is set so as to satisfy B pattern > A pattern, conductive paste larger in the contained amount of conductive filler than conductive paste used in the electrode-forming location 52, for example, is used in the electrode-forming location 53. Note that electrodes of each pattern may be formed in the same location with the printing plate, the electrode material and the printing condition, etc. changed over.

Subsequently, two types of solar cells 11A and 11B different in electrode structure from each other and manufactured by the above-described steps (S13 and S14) are grouped and modularized (S15). The quantitative ratio between the solar cells 11A and 11B is, for example, 11A:11B=9:1. The solar cell module 10 can be manufactured by stacking the respective constituent members and letting the members go through a thermocompression bonding lamination process. In this case, the encapsulant 14 is supplied in the form of, for example, a film having a thickness of 0.1 mm to 1.0 mm or so. The plurality of solar cells 11A and 11B is connected in series using the wiring material 15. Consequently, there are fabricated strings in which the plurality of solar cells 11A and 11B are laid out in arrays on the same plane. The wiring material 15 can be attached to the electrodes of the solar cells 11A and 11B using, for example, an adhesive material made from filmy or pasty thermosetting resin.

In the lamination process, a first resin film composing the encapsulant 14 is stacked on the first protective member 12, and then the abovementioned strings are stacked on the first resin film. In addition, a second resin film composing the encapsulant 14 is stacked on the strings, and then a second protective member 13 is stacked on the second resin film. Then, the respective resin films are laminated by applying a pressure from the second protective member 13 side, while heating the resin films at a temperature at which the films melt. In this way, there is obtained a structure in which the strings are sealed up with the encapsulant 14. Finally, a frame 17, a terminal box and the like are fitted on the structure, thereby manufacturing the solar cell module 10.

Figure 10:
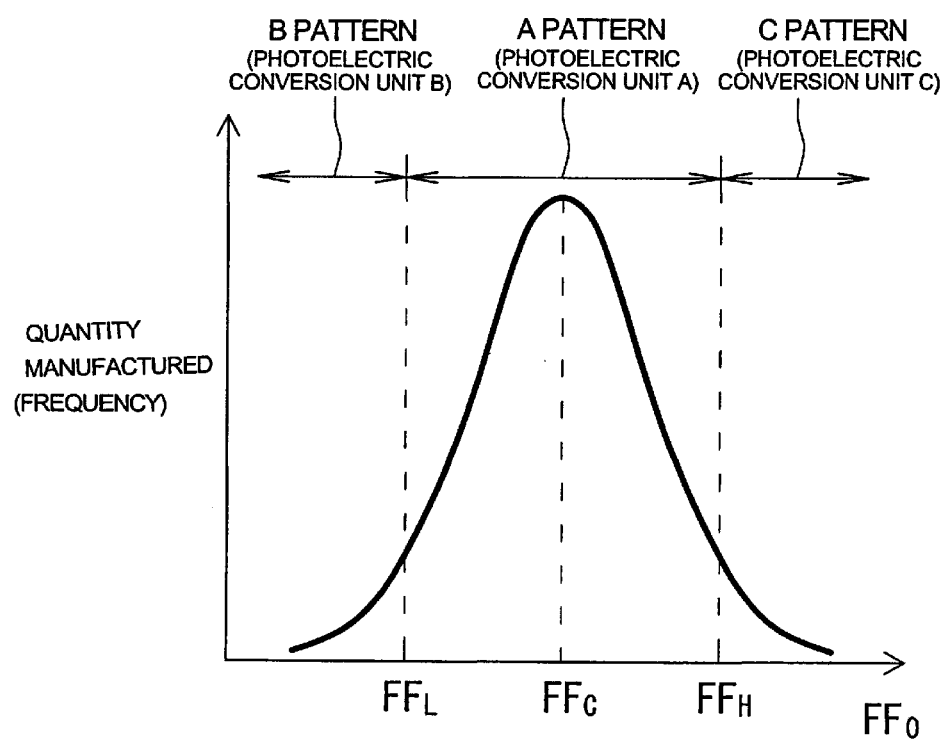
FIG. 10 is a drawing used to describe a method for manufacturing a solar cell and a solar cell module, each of which is one example of embodiments according to the present invention.

In the main process, photoelectric conversion units 20 are classified into two types, i.e., the photoelectric conversion units 20A and 20B. Alternatively, however, photoelectric conversion units 20 may be classified into three or more types. That is, there may be three or more electrode structures to be selected. As a specific example, a class of photoelectric conversion units 20C which exceed a second threshold value (hereinafter referred to as "$FF_H$") having $FF_0$ greater than $FF_C$ is set up, in addition to the photoelectric conversion units 20A and 20B, as illustrated in FIG. 10. For photoelectric conversion units 20C, electrodes are formed according to a C pattern. The C pattern is defined as having an electrode structure higher in resistance than the A pattern. For example, the electrode structure of the C pattern is formed with the electrode thickness, the electrode width, the number of electrodes, or the contained amount of conductive paste thereof made smaller, compared with the A pattern, or with these modifications combined. That is, the amount of electrode material can be reduced more in the C pattern than in the A pattern. $FF_H$ is set in order to, for example, reduce the amount of electrode material and achieve cost reductions for overengineered photoelectric conversion units having $FF_0$ significantly higher than $FF_C$. For example, $FF_H$ can be set so that approximately 10% of the total quantity of photoelectric conversion units 20 correspond to photoelectric conversion units 20C in order from the highest $FF_0$.

In the main process, the electrode structure is changed by setting $FF_C$ as a threshold value. Instead, the electrode structure may be made lower in resistance with a decrease in $FF_0$, without setting the threshold value. In this case, a plurality of ranges may be set in which the electrode structure is either changed or not changed, thereby varying the electrode structure step by step. Alternatively, an arithmetic program in which $FF_0$ and printing conditions are collated with each other may be stored in the manufacturing system 50 to fine-adjust the printing conditions according to $FF_0$.

In the main process, photoelectric conversion units 20 are sorted on the basis of $FF_0$ only to differentiate the photoelectric conversion units 20A and 20B from each other in electrode structure. Instead, photoelectric conversion units 20 may be sorted using a characteristic value other than $FF_0$. Alternatively, the electrode structure may be determined using a characteristic value other than $FF_0$. As a specific example, the pattern of electrode formation is determined on the basis of the sheet resistance $R_0$, short-circuit current $Iso_0$ and $Voc_0$ of photoelectric conversion units 20, as illustrated in FIG. 11.

Figure 11:
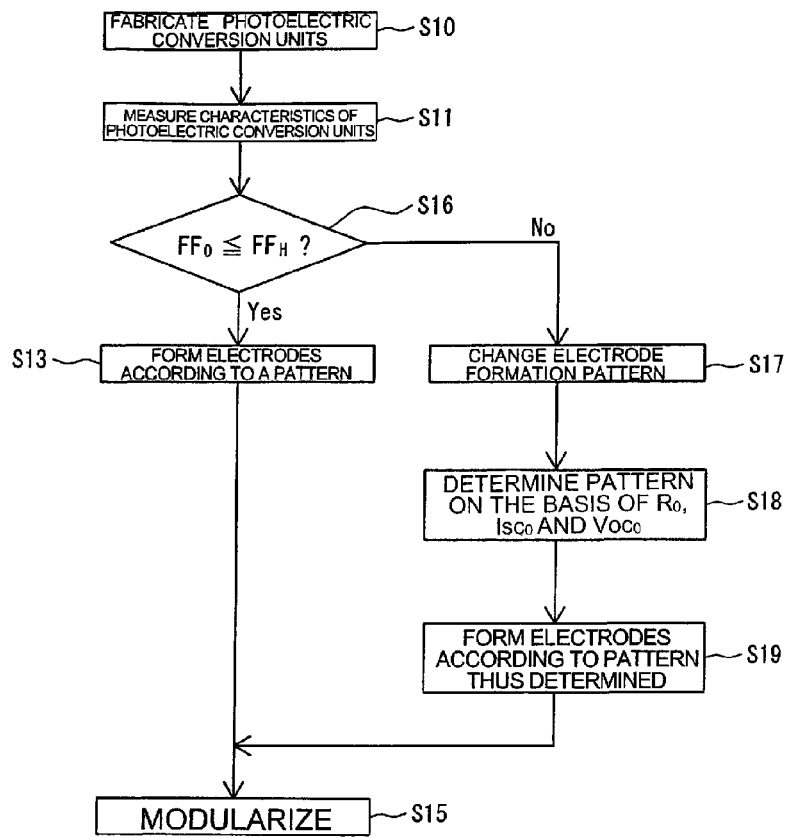
FIG. 11 is a flowchart used to describe a method for manufacturing a solar cell and a solar cell module, each of which is one example of embodiments according to the present invention.

In the example illustrated in FIG. 11, steps S10, S13 and S15 are the same as those illustrated in FIG. 8, and the example further includes, for example, steps S12 and S14 illustrated in FIG. 8. In the example illustrated in FIG. 11, $FF_0$, $R_0$, $Iso_0$ and $Voc_0$ are measured as the characteristic values of photoelectric conversion units 20 manufactured in step S10 (S11). $R_0$ can be measured by a heretofore-known method (for example, a four probe method). $Iso_0$ can be estimated from measured values obtained by measuring the reflectance and thickness of photoelectric conversion units.

Subsequently, $FF_0$ is compared with $FF_H$ which is a second threshold value greater than $FF_C$ (S16). If $FF_0$ exceeds $FF_H$, a determination is made to change to another pattern from the A pattern (S17). That is, if $FF_0$ exceeds $FF_H$, a selection is made of a pattern that is different to the A pattern. The other pattern is, for example, the abovementioned C pattern that is higher in resistance than the A pattern. A plurality of the C patterns can be set as in C1, C2, ... and Cn patterns. When a determination is made to change to a C pattern, one of the C1 to Cn patterns is selected as the electrode pattern on the basis of $R_0$, $Iso_0$ and $Voc_0$ (S18). Then, electrodes are formed according to the pattern thus determined (S19).

In step S18, the electrode pattern is made lower in resistance, for example, with an increase in $R_0$. Likewise, the electrode pattern is made lower in resistance with a decrease in $Iso_0$ and $Voc_0$. When selecting the electrode pattern, consideration may be equally given to $R_0$, $Iso_0$ and $Voc_0$, or importance may be placed on one of these characteristic values. Alternatively, only one or two of $R_0$, $Iso_0$ and $Voc_0$ may be used.

In the example illustrated in FIG. 11, one of the C1 to Cn patterns is selected when a determination is made to change to a C pattern. Instead, an upper limit may be set in $R_0$, for example, and the pattern of electrode formation may be specified as the A pattern if $R_0$ exceeds the upper limit even in a case where $FF_0$ exceeds $FF_H$. That is, a decision can be made not to change the electrode structure if, for example, the sheet resistance is too high in the C pattern. Likewise, lower limits may be set in $Iso_0$ and $Voc_0$, and the pattern of electrode formation may be specified as the A pattern if $Iso_0$ and $Voc_0$ exceed the lower limits even in a case where $FF_0$ exceeds $FF_H$.

Figure 12:
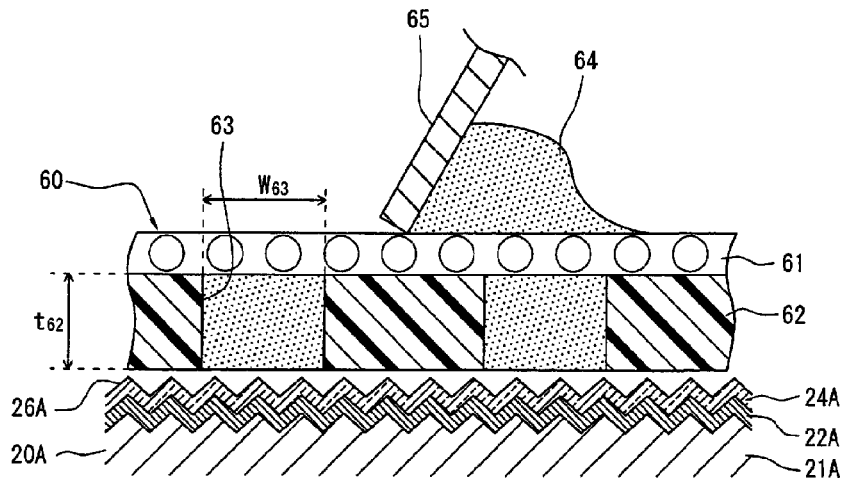
FIG. 12 is a drawing used to describe a method for manufacturing a solar cell which is one example of embodiments according to the present invention.
Figure 13:
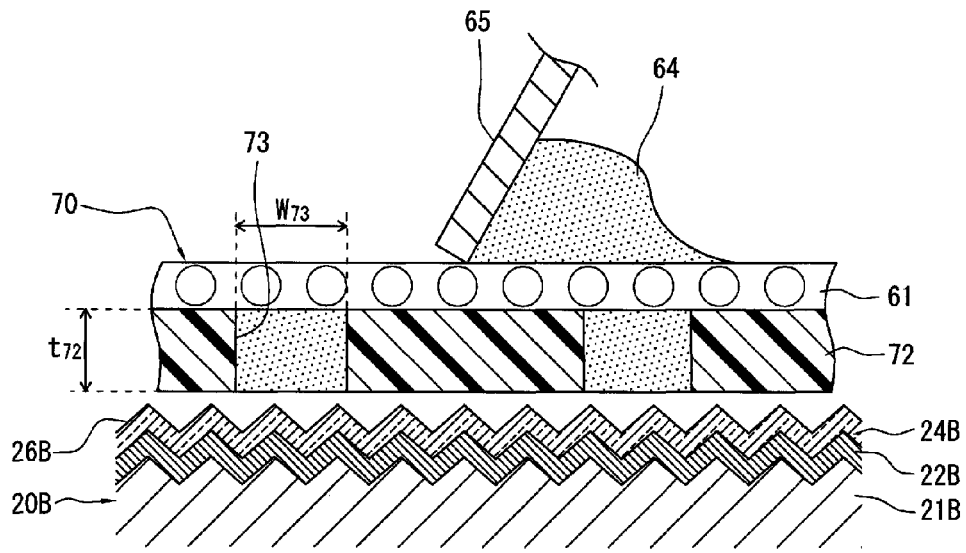
FIG. 13 is a drawing used to describe a method for manufacturing a solar cell which is one example of embodiments according to the present invention.

As illustrated in FIGS. 12 to 15, an electrode structure can also be selected on the basis of the Tx size. FIGS. 12 and 13 illustrate the way electrodes are formed on the photoelectric conversion units 20A and 20B in which texture structures 26A and 26B are formed, respectively, using printing plates 60 and 70.

In the examples illustrated in FIGS. 12 and 13, the Tx size (hereinafter referred to as "Tx size A") of the texture structure 26A is smaller than the Tx size (hereinafter referred to as "Tx size B") of the texture structure 26B. Etching conditions and the like are set so that the Tx size conforms to a predetermined target value, as in the case of $FF_0$ and the like. A variation may occur in the Tx size, however, due to a fluctuation in the conditions. When electrodes are formed by a screen printing method using conductive paste, an interaction among photoelectric conversion units, printing plates and conductive paste changes according to the Tx size. Consequently, the amount of conductive paste coated on photoelectric conversion units generally tends to decrease with a decrease in the Tx size. In addition, the oozing of the conductive paste, i.e., the spread of the conductive paste on the photoelectric conversion units, is reduced with a decrease in the Tx size, thus causing the electrode width to tend to become smaller.

Accordingly, the Tx size of photoelectric conversion units is preferably measured to select a printing plate on the basis of the measured value. Specifically, a selection is made of a printing plate whose coated amount of conductive paste increases with a decrease in the Tx size. That is, when photoelectric conversion units 20A are formed, a printing plate 60 is used whose coated amount of conductive paste is larger than the coated amount of the printing plate 70 used to form the electrodes of photoelectric conversion units 20B.

The printing plate 60 is provided with a mesh 61 spread across an unillustrated frame, and a mask material 62 formed so as to fill the grids of the mesh 61. The mask material 62 is composed using, for example, a photosensitive emulsion, and formed with openings 63 corresponding to an intended electrode pattern left unfilled. In a screen printing process, conductive paste 64 (hereinafter referred to as "paste 64") is placed on the printing plate 60 in which the openings 63 are formed and a squeegee 65 is slid to fill paste 64 in the openings 63. Subsequently, the paste 64 is discharged from the openings 63 and transferred onto the photoelectric conversion units 20A when portions of the printing plate 60 which the squeegee 65 has passed through move away from the surfaces of photoelectric conversion units 20A.

The printing plate 70 is provided with the same mesh 61 as the printing plate 60, and a mask material 72. The mask material 72 is formed according to a pattern that is different from the pattern of the mask material 62. Specifically, the thicknesses $t_{62}$ and $t_{72}$ of the mask materials 62 and 72 and the opening widths $w_{63}$ and $w_{73}$ of the openings 63 and 73 differ from each other, where $t_{62} > t_{72}$ in thickness and $w_{63} > w_{73}$ in opening width. Consequently, the coatability of the paste 64 is made higher when the printing plate 60 is used than when the printing plate 70 is used. Thus, it is possible to suppress a change in the electrode pattern due to, for example, a variation in the Tx size. Only one of the thickness and opening width of each mask material may be changed in the printing plates 60 and 70. The coated amount and thickness of paste, for example, are not in a simple proportional relationship, however. There is therefore the need to previously identify such a relation by experiment or the like. Note that a printing plate having different openings and a different wire diameter of a mesh may be used according to the Tx size.

Different conductive paste may also be used according to the Tx size. For example, a conductive filler containing flaky and spherical fillers can be used as the conductive filler for composing electrodes. The content ratios of flaky and spherical fillers may be selected on the basis of the Tx size. A flakey filler refers to, for example, a filler having an aspect ratio (major axis/minor axis) observed with a SEM of 1.5 or higher, whereas a spherical filler refers to a filler having an aspect ratio of lower than 1.5. In a preferred example of such selection, the ratio of the spherical filler is increased and the ratio of the flaky filler is decreased with a decrease in the Tx size. Consequently, the conductive filler is more easily filled in the concave portions of a texture structure.

Figure 14:
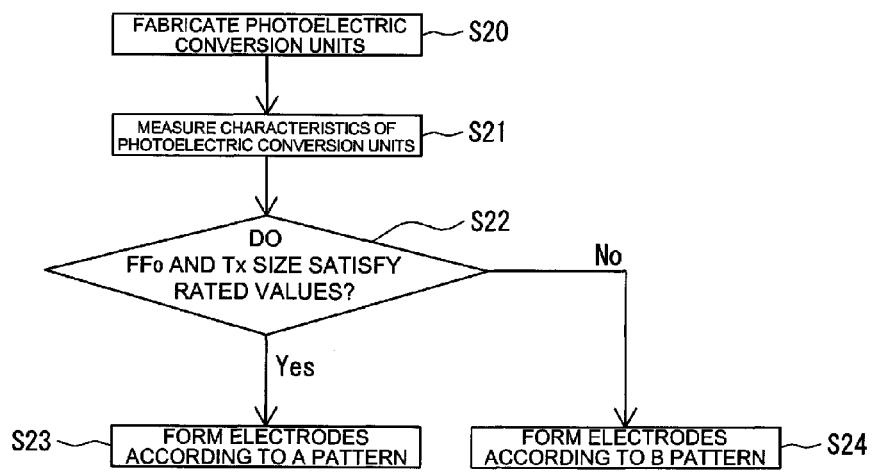
FIG. 14 is a flowchart used to describe a method for manufacturing a solar cell which is one example of embodiments according to the present invention.
Figure 15:
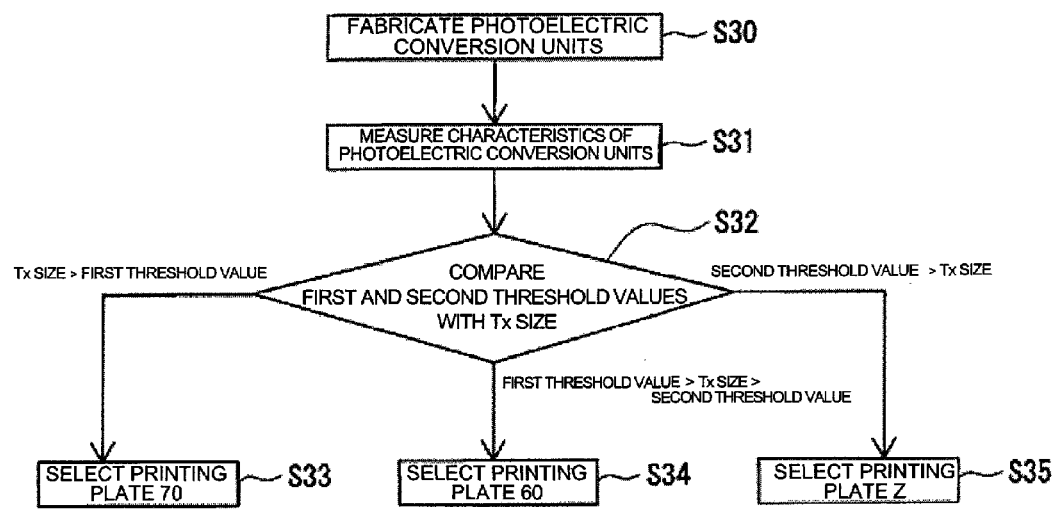
FIG. 15 is a flowchart used to describe a method for manufacturing a solar cell which is one example of embodiments according to the present invention.

FIGS. 14 and 15 illustrate one example of a manufacturing process when the Tx size is included in characteristic values. FIGS. 14 and 15 do not show a process for manufacturing a solar cell module. However, a module can be manufactured by, for example, grouping a plurality of solar cells manufactured in the main process in the same way as described above.

In the example illustrated in FIG. 14, $FF_0$ and the Tx size are measured as the characteristic values of photoelectric conversion units 20 manufactured in step S20 (S21). The Tx size can be measured using a laser microscope or the like, as described above. Texture structures are formed by, for example, immersing a plurality of substrates 21 in a treatment tank filled with an etching liquid. Alternatively, the Tx size may be measured for one or more than one substrate 21 in each cycle of such treatment. Likewise, $FF_0$ is not limited to being subjected to total measurement.

In step S22, both $FF_0$ and the Tx size are compared with rated values in the database. If both $FF_0$ and the Tx size satisfy the rated values, the electrode pattern may be specified as the A pattern. If either one does not satisfy a rated value, the electrode pattern may be specified as the B pattern (S23 and S24). Alternatively, a selection parameter having both values as variables to select an electrode structure may be derived on the basis of $FF_0$ and the Tx size, and the parameter may be compared with the predetermined rated values. Such a selection parameter can be determined by, for example, experiment or simulation. Alternatively, the process may be configured such that an electrode pattern is selected on the basis of $FF_0$ to select a printing plate for forming an electrode pattern selected in consideration of the Tx size.

In the example illustrated in FIG. 15, only the Tx size is measured as the characteristic value of photoelectric conversion units 20 manufactured in step S30 (S31). Subsequently, the measured Tx size is compared with the first and second threshold values of the Tx size which are rated values previously stored in the database (S32) to select a printing plate for screen printing (S33 to S35). Specifically, if the Tx size is larger than the first threshold value, the printing plate 70 may be selected (S33). If the Tx size falls between the first and second threshold values, the printing plate 60 may be selected (S34). If the Tx size is smaller than the second threshold value, a printing plate Z larger in opening width than the printing plate 60, for example, may be used (S35). Thus, an electrode having the same thickness and width can be formed on every photoelectric conversion unit by forming the electrodes using the respective printing plates.

As described above, according to the above-described manufacturing method, the solar cell 11 and the solar cell module 10 having excellent output characteristics can be manufactured at an excellent yield rate.

In the above-described manufacturing method, electrode resistance is decreased by, for example, making the electrode thickness larger in photoelectric conversion units 20B low in $FF_0$ than in photoelectric conversion units 20A high in $FF_0$. Although a fill factor degrades due to the formation of electrodes, a fill factor degradation when photoelectric conversion units 20B are used can be suppressed more than when photoelectric conversion units 20A are used, according to the above-described manufacturing method. That is, the performance failure of photoelectric conversion units can be compensated for by the electrode structure. Consequently, the number of photoelectric conversion units discarded as defective units, for example, can be reduced to improve the yield rate. It is also possible to improve the performance of the solar cell 11 and the solar cell module 10.

In the above-described manufacturing method, electrode resistance is made higher than the electrode resistance of photoelectric conversion units 20A, for example, for over-engineered photoelectric conversion units 20C having significantly high $FF_0$. Consequently, it is possible to reduce the amount of electrode material to be used and reduce the costs of, for example, the solar cell 11 and the solar cell module 10.

REFERENCE SIGNS LIST

10: solar cell module, 11A, 11B: solar cell, 12: first protective member, 13: second protective member, 14:

encapsulant, 15: wiring material, 16: crossover wiring material, 17: frame, 20A, 20B: photoelectric conversion unit, 21A, 21B: substrate 22A, 22B, 23A, 23B: amorphous semiconductor layer, 24A, 24B, 25A, 25B: transparent conductive layer 26A, 26B: texture structure, 30A, 30B: first electrode, 31A, 31B, 41A, 41B: finger electrode, 32A, 32B, 42A, 42B: bus bar electrode, 40A, 40B: second electrode, 50: manufacturing system, 51: characteristic value-measuring location, 52, 53: electrode-forming location, 60, 70: printing plate, 61: mesh, 62, 72: mask material, 63, 73: opening, 64: conductive paste, and 65: squeegee.

The invention claimed is:

1. A solar cell manufacturing method for manufacturing solar cells, each solar cell comprising a photoelectric conversion unit and an electrode formed on the photoelectric conversion unit, the method comprising:
    a first process comprising producing the photoelectric conversion units; a second process performed after the first process, the second process comprising measuring characteristic values of each of the photoelectric conversion units produced in the first process, the characteristic values including at least a fill factor of each of the photoelectric conversion units;
    a third process performed after the second process, the third process comprising comparing the fill factor of each of the photoelectric conversion units with a predetermined threshold value, and selecting a first structure as a structure of the electrodes if the fill factor is equal to or greater than the threshold value, and selecting, as the structure of the electrodes, a second structure lower in resistance, than the first structure if the fill factor is less than the threshold value; and
    a fourth process performed after the third process, the fourth process comprising forming, on each of the photoelectric conversion units of which the characteristic values have been measured in the second process, the electrodes having the first or the second structure that has been selected in the third process.

2. The solar cell manufacturing method according to claim 1, wherein the characteristic values include a size of a texture structure of the photoelectric conversion units.

3. The solar cell manufacturing method according to claim 2, wherein the electrodes contain binder resin and a conductive filler containing a flaky filler and a spherical filler, and content ratios of the flaky filler and the spherical filler are selected on the basis of the size of the texture structure.

4. The solar cell manufacturing method according to claim 2, wherein the electrodes are formed by coating conductive paste on the photoelectric conversion units by a screen printing method using a printing plate, and a selection is made of the printing plate whose coated amount of conductive paste increases with a decrease in the size of the texture structure.

5. The solar cell manufacturing method according to claim 4, wherein at least one of an opening width and a thickness of the printing plate is made larger with a decrease in the size of the texture structure.

6. The solar cell manufacturing method according to claim 1, wherein the characteristic values also include at least one of a short-circuit current, an open-circuit voltage, and a sheet resistance of the photoelectric conversion units.

7. The solar cell manufacturing method according to claim 1, wherein the electrodes include finger electrodes and bus bar electrodes, and, in the third process, as a structure of the finger electrodes, the first structure or the second structure is selected on the basis of the fill factor of the photoelectric conversion units.

8. The solar cell manufacturing method according to claim 7, wherein the second structure has a thickness larger than the first structure.

9. The solar cell manufacturing method according to claim 7, wherein the second structure has at least a larger width or a greater number of finger electrodes compared to the first structure.

10. The solar cell manufacturing method according to claim 1, wherein the electrodes contain a conductive filler and binder resin, and the second structure has a higher conductive filler content compared to the first structure.

11. The solar cell manufacturing method according to claim 1, wherein the electrodes are formed by coating conductive paste on the photoelectric conversion units by a screen printing method using a printing plate, and, as the printing plate, different printing plates are used when forming the first structure and the second structure.

12. The solar cell manufacturing method according to claim 1, wherein a selection of the electrode structure is automatically made by comparing rated values previously stored in a database with the measured characteristic values.

13. A solar cell module manufacturing method comprising connecting in series a plurality of the solar cells manufactured by a manufacturing method according to claim 1 and including at least two types of the solar cells that are different from each other in the electrode structure using a wiring material, and covering the solar cells with a pair of protective members.

* * * * *